(12) United States Patent
Gavra et al.

(10) Patent No.: US 6,885,977 B2
(45) Date of Patent: Apr. 26, 2005

(54) SYSTEM TO IDENTIFY A WAFER MANUFACTURING PROBLEM AND METHOD THEREFOR

(75) Inventors: Yifah Gavra, Los Altos, CA (US); Amos Dor, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 144 days.

(21) Appl. No.: 10/327,174

(22) Filed: Dec. 20, 2002

(65) Prior Publication Data

US 2004/0122859 A1 Jun. 24, 2004

(51) Int. Cl.$^7$ ................................................ G06K 9/00
(52) U.S. Cl. .................. 702/185; 382/149; 382/145; 702/35
(58) Field of Search ............................... 702/182–185, 702/35; 700/109–110; 382/145, 149, 141; 714/732, 737; 438/14; 356/237.1, 237.2, 237.3, 237.4

(56) References Cited

U.S. PATENT DOCUMENTS

| | | | | |
|---|---|---|---|---|
| 5,537,488 A | * | 7/1996 | Menon et al. ............... | 382/170 |
| 5,991,699 A | * | 11/1999 | Kulkarni et al. ............. | 702/83 |
| 6,091,846 A | * | 7/2000 | Lin et al. ..................... | 382/145 |
| 6,246,787 B1 | * | 6/2001 | Hennessey et al. .......... | 382/141 |
| 6,292,582 B1 | * | 9/2001 | Lin et al. ..................... | 382/149 |
| 6,324,298 B1 | * | 11/2001 | O'Dell et al. ................ | 382/149 |
| 6,466,895 B1 | * | 10/2002 | Harvey et al. ............... | 702/181 |
| 6,483,938 B1 | * | 11/2002 | Hennessey et al. .......... | 382/149 |
| 6,701,259 B1 | * | 3/2004 | Dor et al. ..................... | 702/35 |
| 6,741,941 B1 | * | 5/2004 | Obara et al. ................. | 702/35 |
| 6,744,266 B1 | * | 6/2004 | Dor et al. ..................... | 324/751 |
| 6,751,343 B1 | * | 6/2004 | Ferrell et al. ................ | 382/145 |
| 2002/0172412 A1 | * | 11/2002 | Jun et al. ..................... | 382/149 |
| 2003/0072481 A1 | * | 4/2003 | Wooten et al. ............... | 382/145 |

* cited by examiner

*Primary Examiner*—Carol S. W. Tsai
(74) *Attorney, Agent, or Firm*—Blakely Sokoloff Taylor & Zafman

(57) ABSTRACT

A method (400) for determining a response to a wafer manufacturing process problem includes the steps of generating a wafer map signature (406) containing defect attributes to be identified and retrieving (410) one or more wafer map signatures from a database. The wafer map signature to be identified is matched (414) with the one or more wafer map signatures from the database in order to help find a root cause of a defect in a wafer manufacturing process.

This provides at least the advantage that a signature matching capability allows an Operator to more accurately identify a root manufacturing cause of a wafer defect. Furthermore, instant feedback to the wafer manufacturing process can be provided to facilitate rapid correction of manufacturing errors.

36 Claims, 3 Drawing Sheets

FIG. 1

SYSTEM TO IDENTIFY A WAFER MANUFACTURING PROBLEM AND METHOD THEREFOR

FIELD OF THE INVENTION

This invention relates to methods and apparatus for determining and identifying a response to a wafer manufacturing process problem. The invention is applicable to, but not limited to, automated signature matching of semiconductor wafers to determine defect types in a manufactured wafer.

BACKGROUND OF THE INVENTION

The use of semiconductor technology has, over the last few decades, revolutionized the use of electrical and electronic goods. In particular, the increased use of semiconductor technology has resulted from an unappeasable need by business (as well as individuals) for better, smaller, faster and more reliable electronic goods.

The semiconductor wafer manufacturers have therefore needed to make commensurate improvements in product quality, as well as in the speed, quality and reliability of the semiconductor wafer manufacturing process. Clearly, in the mass-manufacture of semiconductor wafers, the manufacturer needs to minimize the number of faulty semiconductor wafers that are manufactured. Furthermore, the manufacturer clearly needs to recognize, as early as possible in the manufacturing process, when faulty semiconductor wafers are being manufactured, so that the manufacturing process can be checked and, if appropriate, corrected.

By continuously inspecting semiconductor wafers throughout the manufacturing process, flawed wafers may be removed and, if appropriate, the wafer or wafer manufacturing process corrected at any of the various manufacturing stages. This is much more preferable than completing the manufacture of a whole batch of wafers, only to find that a fault existed in the wafer manufacturing process, thereby creating a number of defective wafers or by failure of the wafer during use.

Wafer inspection is primarily performed by human visual inspection of manufactured wafers. A known mechanism for performing such an inspection is in the use of a Defect Source Identifier (DSI)™ system, developed by Applied Materials™ Inc. Wafers that exhibit a large number of defects are selected and pictures of the wafers taken. Each pixel/dot on the picture indicates an identified defect. The picture is then passed to the DSI system.

The DSI system requires an Operator to manually review this smart image (picture) of a manufactured wafer and classify it based on its pixel arrangement. An Operator would typically classify a defective wafer by looking at the defective pixel arrangement, for example looking to see if the defective pixels formed a substantially 'star' shaped figure or a 'scratch' shape. A defective wafer 100 is shown in FIG. 1. In this regard, the Operator may classify the defective wafer as one that leaves a bird's footprint impression 120.

Hundreds of previously selected and stored cases/wafer pictures are contained in a defect knowledge library (DKL), operably coupled to the DSI system. In this manner, an Operator may manually retrieve stored pictures from the DKL database and compare the cases of similar classification to the wafer picture received from the inspection tool. The pixel classification can then be manually compared to previously stored wafer patterns, for example looking for similar 'footprint' patterns. The Operator may then determine that particular wafers exhibit similar pixel patterns to previously stored patterns, and therefore may have the same, or similar, defect.

Hence, an Operator uses manual data analysis and manual picture retrieval technology to match current wafer fabrication (FAB) defect problems with historical defect cases accumulated through the Defect Knowledge Library (DKL).

This human visual inspection process is renowned for being inaccurate due to various factors including stress, eye fatigue and boredom of the Operator. Furthermore, it is prone to human judgment and therefore prone to the inconsistencies due to different perceptions by different Operators as to the significance of a finding.

In addition, the above inspection approach has the disadvantage that the process is very time consuming. In this regard, there is a lengthy delay before a particular wafer-manufacturing problem is identified, and steps taken to rectify it.

Finally, the human visual inspection process is limited to a set of pre-defined classifications, which may well not encompass the wafer manufacturing problem that resulted in the wafer defect type encountered.

U.S. Pat. No. 5,129,009 describes a method for inspecting integrated circuits (ICs) and performing direction edge enhancements based on a comparison between first and second edge enhanced images. Defects in images, once located, are classified and combined to form a feature matrix. The feature matrix is then compared to an expert system database having a large number of features matrices associated with defect classifications.

Thus, there exists a need in the field of the present invention to provide an improved method and apparatus for determining a response to a wafer manufacturing process problem, wherein the abovementioned disadvantages may be alleviated.

STATEMENT OF INVENTION

In accordance with a first aspect of the present invention, there is provided a method for identifying a wafer defect in a wafer manufacturing process, as claimed in Claim 1.

In accordance with a second aspect of the present invention, there is provided a wafer defect identification system, as claimed in Claim 23.

In accordance with a third aspect of the present invention, there is provided storage medium storing processor-implementable instructions and/or data, as claimed in Claim 24.

In accordance with a fourth aspect of the present invention, there is provided a wafer defect identification system, as claimed in Claim 26.

Further aspects of the invention are as claimed in the dependent Claims.

In summary, the present invention proposes, inter-alia, to overcome the aforementioned limitations of known wafer inspection processes by describing a method and a system to identify a manufacturing problem that uses automatic signature retrieval and matching of a defective wafer, in the inspection process.

In particular, attributes of defective wafers are used to generate a wafer signature. The signature is then automatically matched with/compared to a number of previously stored wafer map signatures to determine a number of similarity confidence metrics. Preferably, the signature map matching of a particular case is performed in conjunction with a number of other defect attribute matching processes of that case with previously stored cases. If the matching process yields an acceptable similarity metric, the previously stored cases, including aspects such as a wafer map signature is retrieved from the database. Cases are retrieved where a previous problem and associated root cause has been determined. Preferably, the number of cases retrieved is dependent upon a grading applied to the attributes (such as signature) being matched. A determination can then be made as to whether the current case is exhibiting similar defect characteristics to the previously stored case. If a previous root cause has been determined for a similar defect case, an Operator may then inform the wafer manufacturing process of the identified defect. In this manner, early correction of the wafer manufacturing process can be made. Alternatively, if no previous root cause has been determined, the grading of the matching process assists in a further investigation to determine a root cause.

BRIEF DESCRIPTION OF THE DRAWINGS

FIG. 1 illustrates a simple manufactured defective wafer map signature with clustering highlighted.

Figure 2:
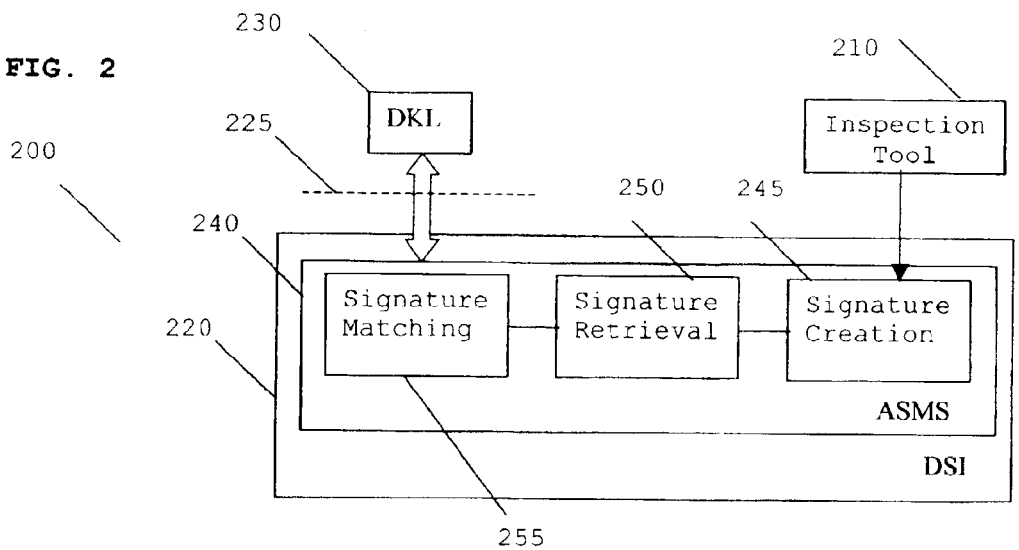
Figure 3:
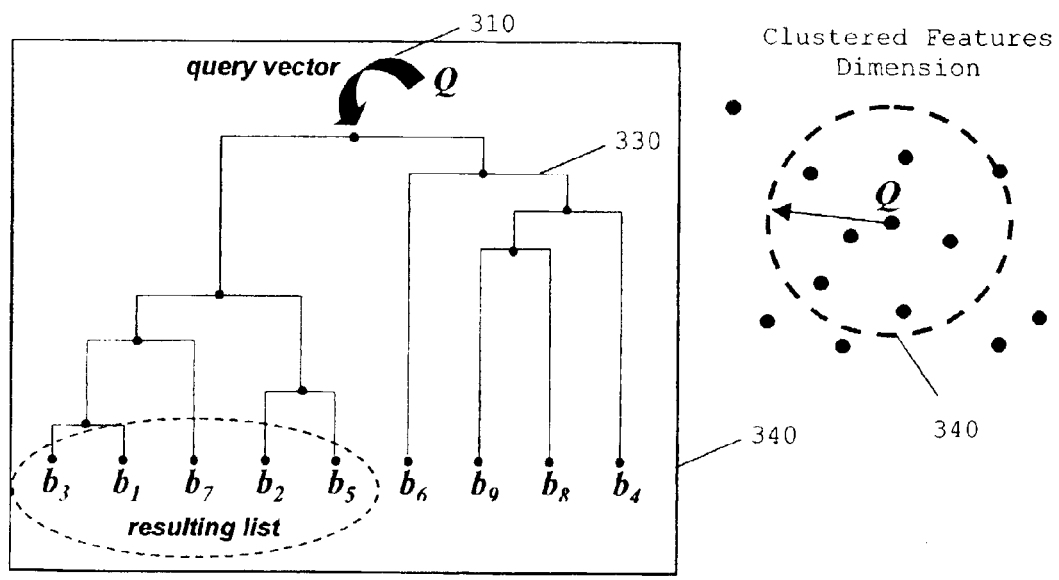
Figure 4:
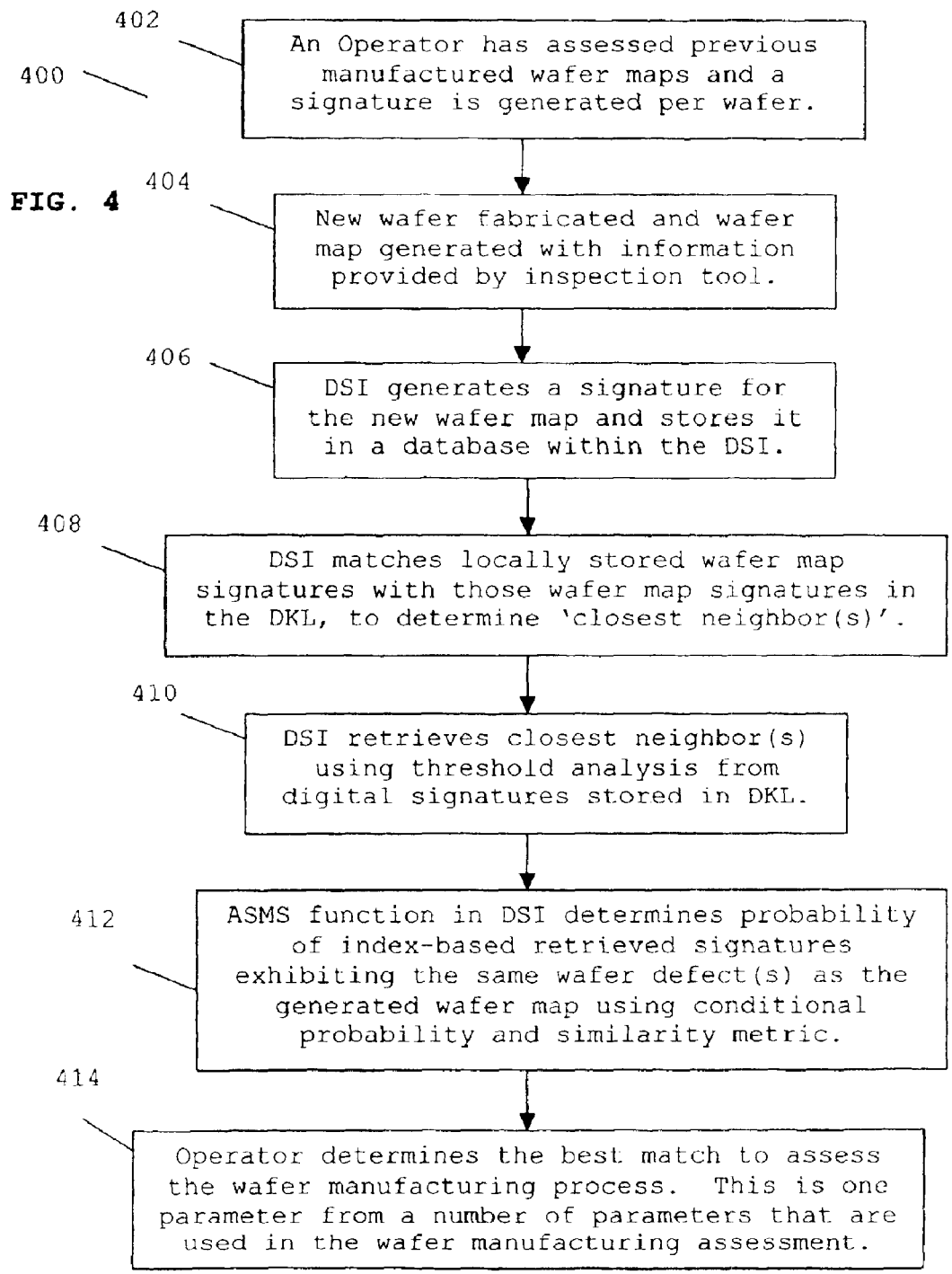

Exemplary embodiments of the present invention will now be described, with reference to the accompanying drawings, in which:

FIG. 2 illustrates an automatic signature retrieval and matching inspection system in accordance with the preferred embodiment of the present invention;

FIG. 3 shows a searching methodology, based on clustered features, for inspecting defective wafers, in accordance with the preferred embodiment of the present invention; and FIG. 4 shows a flowchart illustrating the wafer defect identification method in accordance with the preferred embodiment of the present invention.

DESCRIPTION OF PREFERRED EMBODIMENTS

In the context of the following description, the term 'wafer' is used to encompass bare wafers, patterned wafers, sawn wafers, whole wafers, etc.

In summary, the preferred embodiment of the present invention describes an index-based signature retrieval mechanism. The mechanism is preferably implemented by adapting the DSI system, to index and retrieve signatures from a database, such as a DKL, based on their wafer map patterns. The DSI system is further configured to automatically perform the signature matching operation and grade the results to enable a more intelligent and more accurate assessment of the wafer defect similarities. This is a new and unique application for DSI, which has so far been used solely for manual wafer classification. The improved DSI system is used in order to match new wafer signature maps to signature maps previously stored in the DKL database that are known or have been determined as emanating from a particular wafer manufacturing problem.

Advantageously, the adapted DSI system has the capability to provide wafer map signature retrieval and matching that automatically recognizes wafer defects, substrate differences and imaging modality, i.e. automatically generated wafer features. This also leads to a significant reduction in cycle time. In addition, it helps a Yield Engineer to correlate existing wafer problems to already known and perhaps resolved manufacturing problems.

In addition, as Semiconductor wafer manufacturers generate and maintain thousands of wafer maps from various products, process layers, and review tools, the adapted DSI system has the capability to provide flexible signature retrieval from any wafer maps stored in an accessible database, such as the DKL. In the preferred embodiment of the present invention, which uses DKL, only selected wafers are stored.

The inventors of the present invention have recognized and appreciated that a faulty wafer manufacturing process may produce similar wafer defect attributes and phenomena, therefore generating wafer map signatures that are visually similar. Thus, by adapting the functionality of the DSI system, an automatic mechanism can be used to access previously stored wafer map signatures and perform defect sourcing that is not as reliant upon the vagaries of human judgment.

Referring now to FIG. 2, a system 200 to identify a wafer manufacturing problem is illustrated, in accordance with the preferred embodiment of the present invention. The preferred embodiment of the present invention utilizes the functionality of a DSI system. However, it is envisaged that other functional apparatus, system(s) and/or elements can be used to employ the inventive concepts herein described.

The wafer defect identification system 200 includes an inspection tool 210 that performs a substantially automatic wafer inspection process on a multitude of manufactured wafers. The DSI system 220 is operably coupled to a wafer map database, for example a DKL 230 holding a plurality of defective wafer map signatures. The preferred embodiment of the invention shows the coupling of the DSI to the DKL 230 across an interface 225. In other configurations, the database may, for example, be located within an automatic signature retrieval and matching system (ASMS) 240 or the information is accessible from a remote database, say via the Internet.

The DSI system 220 has been adapted to include ASMS 240 having the following new functional elements:

(i) A signature creator 245;
(ii) A signature retrieval function 250; and
(iii) A signature matching engine 255.

In accordance with the preferred embodiment of the present invention, the inspection tool 210 generates a clarity results file of the defect and passes a number of selected wafer maps to the DSI system 220. Within the DSI system 220, the signature creator 245 uses the wafer defect locations to generate wafer defect signatures.

In this regard, the ASMS 240 provides a capability to automatically receive a wafer default location from the inspection tool 210 and determining interesting and/or pertinent attributes relating to the wafer. In this manner, the signature creator 245 generates a sufficiently identifiable signature of the wafer map to enable the signature retrieval function 250 to retrieve any corresponding wafer maps from the DKL 230.

A preferred example of generating interesting aspects of the wafer utilizes a known clustering technique.

Clustering techniques, such as those used in spatial signature analysis (SSA) algorithms, are used to identify the interesting defect attributes/clusters. For example, the following SSA methodology may be used within the signature creator 245.

The SSA algorithm may then apply a label to identify/represent the clustered area, with the largest (dilated) area then selected by the signature creator 245 as the signature to be used in the retrieval process. In the preferred embodiment of the present invention, a signature creator may be obtained from Oak Ridge National Laboratory at http://www.ornl.gov/

Once the signature creator 245 has generated a signature that is sufficiently identifiable, the signature retrieval algorithm is able to search the previously stored wafer map signatures in the DKL 230. The signature retrieval algorithm selects wafer maps stored in the DKL 230 that exhibit similar attributes to the generated signature. In this regard the signatures effectively provide wafer map feature characteristics, for example, the number of defects, defect positions, cluster shape, surrounding density, orientation, bins (i.e. decision points in the matching algorithm), etc.

In accordance with the preferred embodiment of the present invention, the ASMS 240 is able to store as well as retrieve, wafer map signatures in the DKL 230. It is envisaged that an Operator is provided with the opportunity to select one of these signatures (specific to a particular case) to be transferred into the DKL 230. The wafer map is then stored with its associated signature data, preferably provided by the inspection tool or entered by the Operator. Once the Operator has decided to open a case for this wafer (s)he can export the wafer map and signature to the DKL 230.

In accordance with the preferred embodiment of the present invention, a signature-matching engine 255 is used during the wafer map retrieval process. When matching a new wafer to the wafer maps stored in the DKL, the DSI preferably uses a nearest neighbor algorithm. In this regard, the DSI compares the signature of the recently created wafer map to those previously stored in the DKL 230. The DSI 220 effectively performs knowledge correlation between the existing problem and a previous historical problem. The DSI system 220 preferably uses a signature-based query-by-example method to locate and retrieve a similar signature from a database of digital signatures.

In an enhanced embodiment of the present invention, the DSI system 220 collects historical statistical information that is associated with the digital signature records in the database and provides the user with a listing of solution paths with confidence levels (i.e. statistical significance) for each proposed case match. In this manner, the signature-matching engine 255 of the DSI system 220 is able to select a set of the closest wafer map signatures to the signature being searched. The results of the query can be used to estimate probable root cause and/or generate classification labels in the sense of an automatic defect classification system. This approach is further described in FIG. 3.

Furthermore, in this embodiment the ASMS 240 is implemented preferably in a digital signal processor or computer. However, it is within the contemplation of the invention that the signature retrieval algorithm, signature matching algorithm and/or any associated threshold levels as described in the above embodiments may be embodied in any suitable form of software, firmware or hardware.

Advantageously, the DSI system 220 is able to use index-based signature retrieval technology to retrieve a set of signatures from an historical database that has been established for DSI. The DSI system 220 uses on-line, in-line, and/or off-line defect inspection and identification equipment technology for its own use. Each signature record in the database preferably contains a description of the process tools and equipment that the product was exposed to prior to each case capture. In this regard, the signature record represents a characterization of the manufacturing process.

A case, in the context of the present invention, is an electronic document residing in the DKL, which is a collection of wafer attributes, such as classification, size, etc.

The retrieved group of cases, exhibiting similar visual patterns, effectively provides a statistical sample of the conditional probability associated with the errant process that resulted in the query signature. A conditional probability distribution of tool and defect type may then be mathematically combined with, for example, an index-based signature retrieval similarity metric, as described with reference to FIG. 3, to arrive at a probabilistic recommendation of the likely errant process that must be corrected. If the metric indicates a good case, it is deemed that the case provides a significant suggestion at the corrective action to be taken. If the metric indicates a less representative case, then the case is assumed to provide a useful starting point for further investigation. The combined grade of all cases, suggest a list of suspect tools.

Advantageously, this process is performed automatically and off-line, so that the manufacturing errors can be corrected quickly, thereby improving subsequent product quality and yield. The result of the DSI application of this technology is an automated method for localizing and identifying errant process equipment, whilst using historical database information to recommend corrective actions. In accordance with the preferred embodiment of the present invention, the signature matching process provided by the ASMS is an additional parameter for such identification.

Thus, in the enhanced embodiment of the present invention, the signature-matching engine 255 develops a similarity measure that is used to rank the returned list of signatures relative to the query signature. Signatures that are most similar to the query have values near 1.0 while signatures that are dissimilar have values substantially less than 1.0. In the enhanced embodiment, the inventors have set a configurable threshold of 0.95 or above to indicate a signature 'match' of similar grading.

The selected threshold value, say of 0.95, is preferably stored in the DSI 220. The threshold value may be set/selected via a user interface (not shown). It is also envisaged that one or more thresholds of the confidence metric may be pre-determined or selected after the creation of the wafer map's signature, to limit the number of wafer maps that are retrieved. Furthermore, the one or more threshold value(s) may be pre-determined for a particular wafer, or they may be re-programmed in the DSI as further tests on the manufactured wafers are analyzed.

The similarity metric is proportional to one minus the L-norm distance between the returned signature and the query. This is, therefore, proportional to the distance between two points in the multi-dimensional hyperspace of the feature representation.

Each time a wafer map signature is entered into the DKL 230 or a new wafer is inserted into the DSI system 220; all related signature data are stored and indexed. The goal of indexing is to organize the signature features in the database to facilitate rapid retrieval of similar signatures. Preferably, in the ASMS 240, this is formulated as a binary decision tree implemented using an approximate nearest neighbors (ANN) method, as shown in FIG. 3.

Referring now to FIG. 3, the binary decision tree 300 is shown. A query vector 310 is input to the decision making process and a determination is made as to the approximate number of pixels in a particular range 320. Dependent upon whether the number is greater or less than a given threshold, the query vector follows a particular branch of the tree 330. This process is continued for other ranges, whereby further decision points are reached and an optimal path selected. In this manner, a decision bin 340, from a number of decision bins, is ultimately reached. The selected decision bin provides an indication of the dimension of a clustered feature set for the input query vector 310. Thus, an indexing mechanism to classify a number of query vectors can be used to retrieve similar stored data in a much faster manner.

It is envisaged that the ASMS 240 within the DSI system 220 may be controlled by processor-implementable instructions for carrying out the methods and processes described above. The processor-implementable instructions may include one or more of the following:

(i) A signature creation algorithm;
(ii) A signature storage algorithm;
(iii) A signature retrieval algorithm;
(iv) A signature-matching algorithm;
(v) An algorithm to set or adjust confidence or similarity metrics, and/or related threshold levels; or
(vi) Information relating to the product, wafer type or layer of a wafer that has been used to generate the wafer map.

The processor implementable instructions may therefore be input to a memory element, for example, a random access memory (RAM) or programmable read only memory (PROM), or a removable storage medium such as a disk, or any other suitable medium, within the ASMS 240 or DSI 220.

Referring now to FIG. 4, a flowchart 400 illustrates the wafer defect identification method in accordance with the preferred embodiment of the present invention. It is assumed that a number of previously manufactured wafer maps/cases have been generated, and signatures of the wafer maps created and stored for particular cases on one or more databases, as shown in step 402. The one or more databases (say within DKL) are accessible by the automatic signature retrieval and matching system.

When a new wafer is fabricated, and a wafer map generated to indicate defects in the wafer following wafer inspection by an inspection tool, in step 404, an Operator may decide to identify the type of defect exhibited by the wafer. In this regard, the Operator passes the wafer to a DSI system, which generates a signature of the wafer in step 406. Preferably, this wafer map signature is stored in a database within the DSI for subsequent retrieval in a wafer signature matching process. The wafer map signature may also be subsequently stored in a DKL.

The signature matching function of the ASMS within the DSI then performs a matching exercise to determine which of the previously stored wafer signatures are similar to the locally stored wafer signature of the new wafer, in step 408. The DSI, in step 410, then retrieves automatically all of the cases that were selected from the DKL for review by the Operator; say those cases whose determined similarity metric was above a threshold. Similarity and confidence metrics are preferably used, together with appropriate threshold settings, as shown in step 412. The Operator is then able to estimate the likely cause of the defects based on the comparison with previously stored wafer signatures, and their associated record entries, as shown in step 414.

In the preferred embodiment, the DSI system and associated ASMS functions may be implemented using a host computer, for example with one or more dedicated signal-processing cards. Although the preferred embodiment of the present invention has been described with reference to a DSI-based system, it is envisaged that the inventive concepts are applicable to any signature matching system.

Thus, the inventors of the present invention have developed a system and a number of algorithms for identifying wafer defects. In addition, the inventors of the present invention have also proposed mechanisms for characterizing the similarity probability that signatures of previously stored wafer maps are representative of the currently analyzed wafer map signature. Therefore, the wafer manufacturing process may be determined as suffering from the same, or a similar, manufacturing problem as a previous problem based on the signature wafer map that generated the highest probability rating.

It will be understood that the wafer defect identification mechanism, as described above, provides at least the following advantages:

(i) A signature matching capability in DSI allows an Operator to more accurately identify a root cause of a wafer-manufacturing defect that had been previously observed.
(ii) The automatic wafer defect identification process may be performed in a single step.
(iii) The automatic wafer defect identification process has negligible impact on the manufacturing/inspection cycle time and can therefore attain up to 100% sampling rate.
(iv) Instant feedback to the Operator can be provided to assist, if required, adjustment of the wafer manufacturing process.
(v) The automatic wafer defect identification process is not as reliant upon the vagaries of human judgment.
(vi) The automatic wafer defect identification process automatically provides a higher manufacturing yield.
(vii) The ASMS allows a user to look on the DKL for other cases with a similar signature, as part of a manual search.

Whilst the specific and preferred implementations of the embodiments of the present invention are described above, it is clear that one skilled in the art could readily apply variations and modifications of such inventive concepts.

Thus, an improved method and apparatus for automatic wafer defect identification has been described wherein the aforementioned disadvantages associated with prior art arrangements have been substantially alleviated.

We claim:

1. A method for determining a response to a wafer manufacturing process problem, the method comprising the steps of:

generating a wafer map signature corresponding to a wafer that contains defect attributes associated with a wafer manufacturing process;

retrieving one or more stored wafer map signatures from a database, wherein each of the one or more stored wafer man signatures include a description of process tools and/or equipment that the wafer was exposed to prior to signature capture;

matching said wafer map signature with said one or more stored wafer map signatures from said database;

calculating a conditional probability distribution of a process tool type or a determined wafer defect type based on the wafer map signature to be identified; and combining the calculation with a wafer map signature similarity metric to arrive at a probabilistic recommendation of the wafer manufacturing process to be corrected.

2. The method for determining a response to a wafer manufacturing process problem according to claim 1, further comprising the step of:

determining, for a number of said retrieved wafer map signatures, a similarity metric relating to a signature similarity between said retrieved wafer map and said wafer map signature to be identified.

3. The method for determining a response to a wafer manufacturing process problem according to claim 1, the method further comprising the step of adding a new case to a database of cases if said step of matching fails to yield an acceptable match, wherein said wafer map signature is one defect attribute of a case.

4. The method for determining a response to a wafer manufacturing process problem according to claim 3, the method further comprising the step of applying one or more thresholds to said step of matching in order to select a subset of said stored wafer map signatures that exhibit similar defect attributes to said wafer map signature to be identified.

5. The method for determining a response to a wafer manufacturing process problem according to claim 1, wherein said step of generating a wafer map signature includes the step of automatically generating a wafer map signature based on defect attributes of said wafer map signature to be identified.

6. The method for determining a response to a wafer manufacturing process problem according to claim 1, the method further comprising the preceding steps of storing and selecting a plurality of cases in a database, wherein the plurality of cases include wafer map signatures, a number of which are to be retrieved in said step of matching.

7. The method for determining a response to a wafer manufacturing process problem according to claim 1, the method further comprising the step of storing said wafer map signature to be identified in a database.

8. The method for determining a response to a wafer manufacturing process according to claim 1, the method further comprising the step of grading a result of said step of matching to enable a most similar case that exhibits a most similar wafer map signature to be identified.

9. The method for determining a response to a wafer manufacturing process problem according to claim 1, the method further comprising the step of estimating a manufacturing process problem associated with said wafer map signature based on a previously identified wafer manufacturing process problem associated with said closest matching wafer map signature.

10. The method for determining a response to a wafer manufacturing process problem according to claim 9, the method further comprising the step of adapting a manufacturing process based on said step of estimating.

11. The method for determining a response to a wafer manufacturing process problem according to claim 1, the method further comprising the step of indexing said wafer map signatures to organize the signature features in the database to facilitate rapid retrieval.

12. The method for determining a response to a wafer manufacturing process problem according to claim 1, wherein said step of matching a wafer map signature further includes matching at least one of product defects, substrate differences, and imaging modality in order to determine a set of closest matches.

13. The method for determining a response to a wafer manufacturing process problem according to claim 1, wherein said step of generating a wafer map signature includes generating a signature of a bare wafer, a patterned wafer, a sawn wafer, a whole wafer, and a multi-chip module.

14. The method for determining a response to a wafer manufacturing process problem according to claim 1, wherein the method further includes the step of:
defining at least one threshold value based on an analysis of said wafer map signature of said wafer to be identified.

15. The method for determining a response to a wafer manufacturing process problem according to claim 14, wherein said at least one threshold value is pre-determined for a particular wafer type.

16. The method for determining a response to a wafer manufacturing process problem according to claim 15, wherein said at least one threshold value is programmed into a computer to he used for automatically determining a response to a wafer manufacturing process problem.

17. The method for determining a response to a wafer manufacturing process problem according to claim 14, the method further comprising the step of:
applying at least one threshold value to said similarity metric to determine a set of closest matches between said wafer map signature to be identified and said retrieved wafer map signature.

18. The method for determining a response to a wafer manufacturing process problem according to claim 1, wherein the step of generating a wafer map signature is based on at least one of the number of defects, defect positions, cluster shape, surrounding density, and orientation, bins.

19. The method for determining a response to a wafer manufacturing process problem according to claim 1, wherein the step of matching employs a nearest neighbor algorithm.

20. The method for determining a response to a wafer manufacturing process problem according to claim 1, wherein the step of retrieving includes retrieving a set of wafer map signatures that are similar in structural content and/or visual appearance to said wafer map signature to be identified.

21. A system to identify a manufacturing problem adapted to perform the method steps of claim 1.

22. A storage medium storing processor-implementable instructions and/or data for controlling a processor to carry out the method of claim 1.

23. The storage medium storing processor-implementable instructions and/or data according to claim 22, wherein the processor-implementable instructions and/or data includes at least one of the following:

(i) A signature creator to generate a wafer map signature indicative of a wafer manufacturing process problem;

(ii) A signature storage algorithm;

(iii) A signature retrieval function operably coupled to a database for retrieving a wafer map signature from the database corresponding to the wafer manufacturing process problem;

(iv) A signature-matching engine to select the closest set of wafer map signatures to the signature being searched;

(v) An algorithm to set or adjust confidence or similarity metrics, and/or related threshold levels; or (vi) Information relating to the product, wafer type or layer of a wafer that has been used to generate the wafer map.

24. A system to identify a manufacturing problem comprising:
a signature creation function configured to create a wafer map signature corresponding to a wafer that contains defect attributes to be identified and associated with a wafer manufacturing process;

a database, operably coupled to said signature creation function and configured to store a plurality of wafer map signatures;

a signature retrieval function, operably coupled to said signature creation function and configured to retrieve one or more wafer map signatures from said database, wherein each of the one or more stored wafer map signatures include a description of at least one of process tools and equipment that the wafer was exposed to prior to signature capture; and a signature matching function, operably coupled to said signature retrieval function and configured to match said wafer map signature to be identified with said one or more wafer map signatures retrieved from said database, to calculate a confidence metric based on a similarity between said wafer map signature to be identified with said one or more wafer map signatures retrieved from said database, to calculate a conditional probability distribution of a process tool type or a determined wafer defect type based on the wafer man signature to be identified, and to combine the calculation with the confidence metric to arrive at a probabilistic recommendation of the wafer manufacturing process to be corrected.

25. The system to identify a manufacturing problem according to claim 24, wherein one or more signal processors is operably coupled to said database to perform one or more of: the signature creation function, signature retrieval function and/or signature matching function.

26. The system to identify a manufacturing problem according to claim 25, wherein one or more signal processors calculates a wafer map signature similarity between said retrieved wafer map signature and said wafer map signature to be identified.

27. The system to identify a manufacturing problem according to claim 25, wherein said one or more signal processors applies a threshold in said matching function to select a subset of said stored wafer map signatures that exhibit similar defect attributes to said wafer map signature to be identified.

28. The system to identify a manufacturing problem according to claim 25, wherein one of said one or more signal processors stores said wafer map signature to be identified in said database.

29. The system to identify a manufacturing problem according to claim 25, wherein one of said one or more signal processors estimates a wafer manufacturing fault associated with said wafer to be identified, said wafer manufacturing fault including at least one of product defects, substrate differences, imaging modality, and is based on a wafer manufacturing fault associated with said retrieved wafer map signature that closely matches said wafer map signature to be identified.

30. The system to identify a manufacturing problem according to claim 24, wherein said database is indexed to facilitate rapid retrieval of said wafer map signatures.

31. The system to identify a manufacturing problem according to claim 24, wherein said signature creation function creates a wafer map signature of defect attributes to be identified, where said wafer is one of a bare wafer, a patterned wafer, a sawn wafer, a whole wafer, and a multi-chip module.

32. The system to identify a manufacturing problem according to claim 24, wherein said signature matching function applies at least one threshold value to said confidence metric calculation to determine which wafer map signatures are to be retrieved from said database by said signature retrieval function.

33. The system to identify a manufacturing problem according to claim 24, wherein said signature matching function employs a nearest neighbor algorithm.

34. The system to identify a manufacturing problem according to claim 24, wherein said signature creation function creates a wafer map signature based on at least one of a number of defects, defect positions, cluster shape, surrounding density, orientation, and bins.

35. The system to identify a manufacturing problem according to claim 24, wherein said signature creation function creates a wafer map signature containing a description of process tools and/or equipment that said wafer was exposed to prior to signature creation.

36. The system to identify a manufacturing problem according to claim 25, wherein said one or more signal processors adds a new case to said database of cases if said matching function fails to yield an acceptable match, wherein said wafer map signature is one defect attribute of a case.

* * * * *